(12) United States Patent
Staker et al.

(10) Patent No.: US 6,649,987 B1
(45) Date of Patent: Nov. 18, 2003

(54) MEMS HYBRID STRUCTURE HAVING FLIPPED SILICON WITH EXTERNAL STANDOFFS

(75) Inventors: Bryan P. Staker, Pleasanton, CA (US); Douglas L. Teeter, Jr., Mountain View, CA (US); Andres Fernandez, Dublin, CA (US); David T. Amm, Sunnyvale, CA (US)

(73) Assignee: Glimmerglass Networks, Inc., Hayward, CA (US)

( * ) Notice: Subject to any disclaimer, the term of this patent is extended or adjusted under 35 U.S.C. 154(b) by 30 days.

(21) Appl. No.: 09/975,119

(22) Filed: Oct. 9, 2001

(51) Int. Cl.[7] .............................................. H01L 29/82
(52) U.S. Cl. ................................. 257/417; 438/50
(58) Field of Search .............................. 257/415, 417; 438/50

(56) References Cited

U.S. PATENT DOCUMENTS

| | | | | |
|---|---|---|---|---|
| 5,682,053 A | * | 10/1997 | Wiszniewski | 257/401 |
| 6,159,385 A | * | 12/2000 | Yao et al. | 216/2 |
| 6,233,087 B1 | * | 5/2001 | Hawkins et al. | 359/290 |
| 6,383,832 B1 | * | 5/2002 | Nakabayashi | 438/50 |

* cited by examiner

Primary Examiner—Long Pham
Assistant Examiner—Howard Weiss
(74) Attorney, Agent, or Firm—Townsend and Townsend and Crew LLP; Kenneth R. Allen

(57) ABSTRACT

A structure of a hybrid MEMS structure is provided wherein a plate comprises a thin actuatable layer of conductive silicon, such as a MEMS actuatable element, and a thicker handle layer of conductive silicon to provide structural integrity which are separated by a thin oxide, together forming an SOI wafer. This plate is mounted to a substrate, typically ceramic, with the thin actuatable layer facing the substrate and separated by an air gap that is formed by creating, on the substrate, insulator standoffs which come in contact with the plate. A suitable dielectric material useful as a standoff on the substrate is a footrest that permits high aspect ratios.

8 Claims, 4 Drawing Sheets

(NOT ACCORDING TO THE INVENTION)

MEMS HYBRID STRUCTURE HAVING FLIPPED SILICON WITH EXTERNAL STANDOFFS

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

This invention relates to electro ceramic components such as MEMS arrays and methods for fabricating electro ceramic components that can tolerate higher actuation voltages and operate with higher efficiency. Components are MEMS arrays or other micromachined elements.

Conventional MEMS array structures comprise Silicon on Insulator (SOI) array structures on which is fabricated an integrated electrode array. One of the problems encountered is voltage breakdown between electrostatically actuated elements and surrounding structures. The problem is evidently related to control of the electrostatic fields associated with high potential differences over short distances in the cavity structure and between the top surface of the electrostatic actuation electrodes and the bottom surface of the MEMS actuation element (hereafter referred to as the air gap) due to limitations of minimum wafer thickness of an SOI wafer where the air gap is nominally set by wafer thickness.

Typical structures have a conductive handle which is electrically connected to the thin actuatable layer. When these devices are connected to a potential, the fringing fields are forced beneath the mirror, reducing the available electrostatic force for a given amount of voltage. This necessitates a design wherein the mirrors have torsional hinge elements with greater compliance, resulting in slower devices with lower yield.

What is needed is a solution that preserves integrity of the structure of the actuatable element and allows an increase in the effective voltage without the danger of electrical breakdown.

SUMMARY OF THE INVENTION

According to the invention, a structure of a hybrid Micro Electro Mechanical System (MEMS) is provided wherein a plate comprises a thin actuatable layer of conductive silicon, such as a MEMS actuatable element, and a thicker handle layer of conductive silicon to provide structural integrity which are separated by a thin oxide, together forming an SOI wafer. This plate is mounted to a substrate, typically a ceramic, with the thin actuatable layer facing the substrate and separated by an airgap that is formed by creating, on the substrate, standoffs which come in contact with the plate. A suitable dielectric material useful as a standoff on the substrate is a photoresist that permits high aspect ratios (such as a 5:1 height to width ratio). Separation may be effected by other materials and deposition methods, such as by a screen printed adhesive, an electroformed standoff or glass beads. The plate may be attached using a mechanical fastening technique that permits heterogeneous expansion, as for example through a form of rivet. The plate of this structure, typically formed of Silicon on Insulator is referred to as a "Flipped SOI" because the handle is not mounted on the substrate, which is typical of these devices. Instead, the handle is unmounted, and the support is by means of standoffs.

This structure solves two problems: The first problem is potential voltage breakdown. The present structure mitigates this problem for a certain class of MEMS. In the particular case of a double-gimbaled mirror wherein the actuation force is created between the mirror element and the juxtaposed electrodes formed in the substrate, the applied voltage and resultant force can be boosted because the fringing fields can now spread onto the standoff (where the standoff is a dielectric or conductive material of a high resistivity). The advantage gained can be significant, allowing the device to be subjected to nearly double the electrostatic force for a given voltage as compared to conventional structures. The force enhancement effect of this type of a stand-off is configuration dependent, based on the height of the airgap, the overall size of the actuatable element, and the design of the double-gimbaled mirror. The fringing field problem, which increases with the aspect ratio of the air gap to the size of the device, is mitigated by this invention, permitting larger airgaps, greater tilt angle, faster displacement for a given voltage and higher breakdown voltage for a given gap.

The second problem solved is control of the airgap. The airgap of the actuatable element is now controlled by a separate deposition or electro-forming process. This decouples the airgap height from the handle thickness. Handle thickness is constrained to be within a narrow range. A handle thickness that is greater than or less than this range causes difficulties in fabrication and handling of the device due to its fragility.

However, the standoff according to the invention introduces a potential problem of susceptibility to fringing fields that may penetrate through them, causing crosstalk to adjacent MEMS elements. To mitigate this crosstalk problem, the substrate is coated with a highly resistive conductive material.

A further problem that arises by using this technique is vignetting of light for cases where light is obstructed by the handles of the flipped SOI structure. This problem is mitigated by construction of the handle with chamfered or terraced walls The invention will be better understood by reference to the following detailed description in conjunction with the accompanying drawings.

Figure 1:
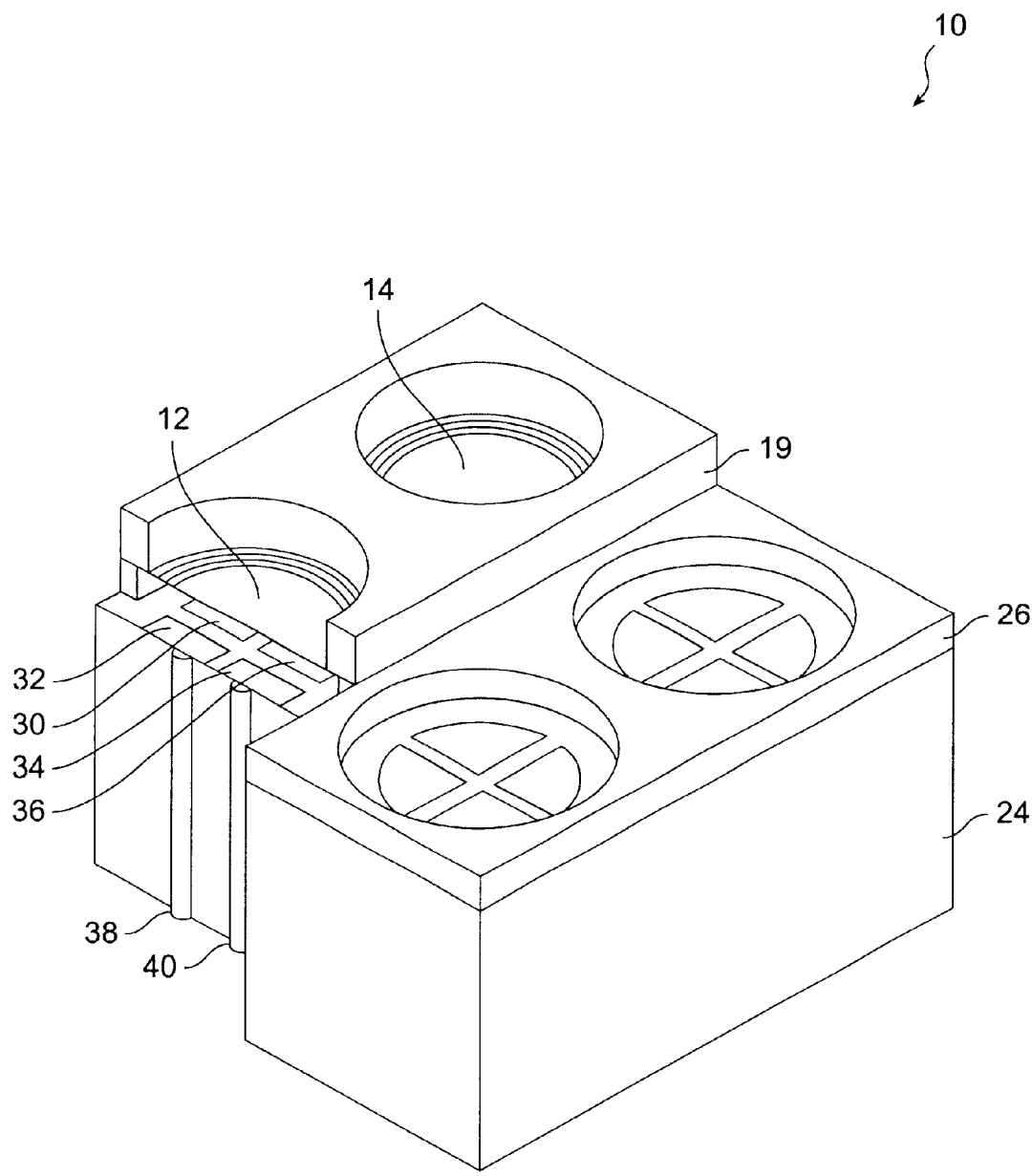
FIG. 1 is a perspective view in partial cutaway of the device according to the invention.
Figure 2:
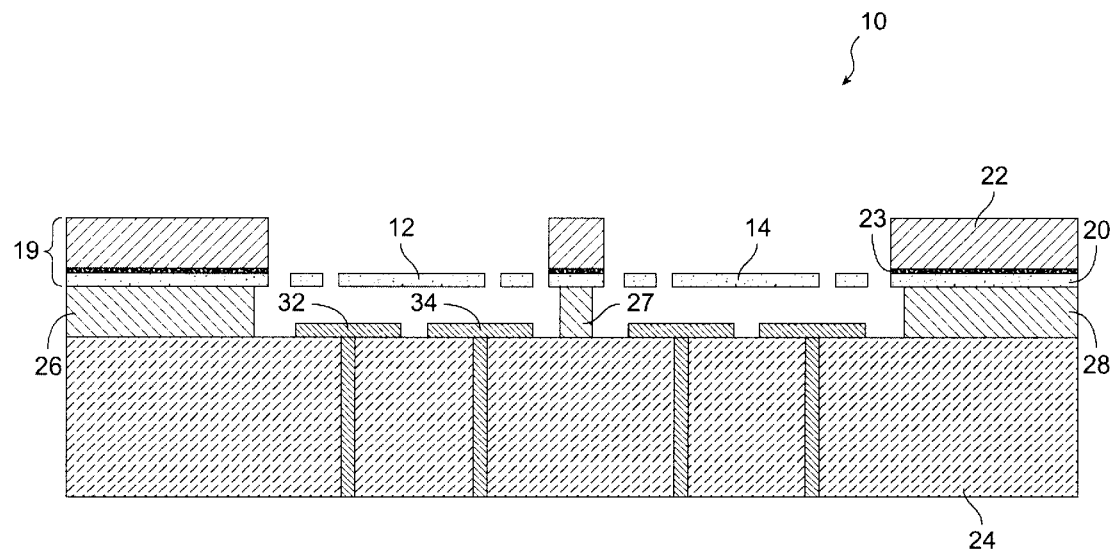
FIG. 2 is a cross-sectional view of a device according to the invention.
Figure 6:
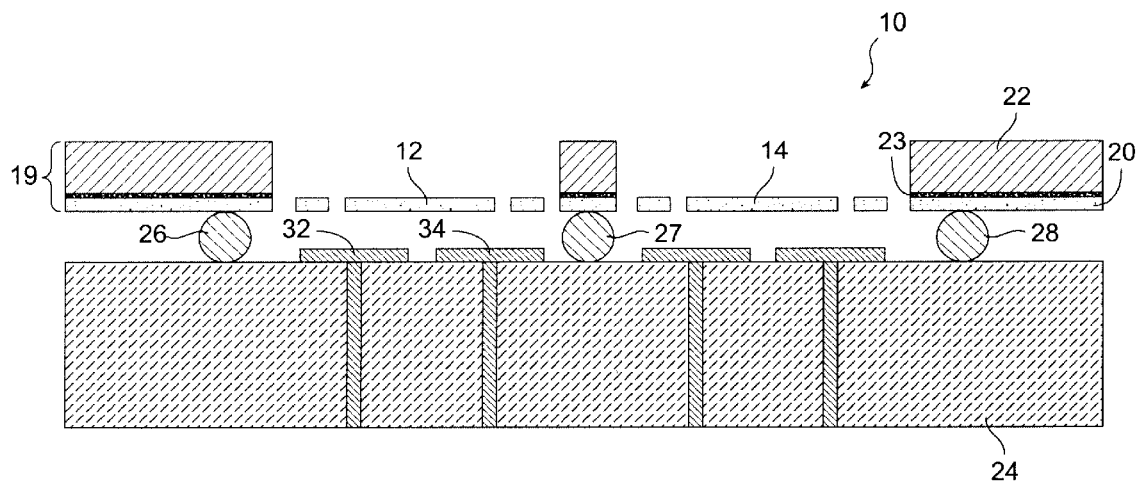
FIG. 6 is a cross-sectional view of a device according to the invention.

Reference is made to FIG. 1 and FIG. 2 in which is shown an array 10 of MEMS elements as for example 12 and 14. A plate 19 is provided. It is formed of a thin actuatable layer of conductive silicon 20, structured as for example as a MEMS mirror, and a thicker handle layer 22 of conductive silicon which provides structural integrity. These layers 20, 22 are separated by a thin oxide 23, which together form the plate 19, herein called an SOI wafer. This plate 19 is mounted to a substrate 24, typically of ceramic, with the thin actuatable layer 20, according to the invention, facing the substrate 24 and separated by an airgap that is formed by providing, on the substrate, standoffs 26, 27 and 28. The standoffs, which may or may not be formed of a contiguous material, come in contact with the plate 19. The standoffs may be formed of a single element with cutouts for the mirrors 12 and 14, etc. and associated cavities, or they may be-ribs laid down between the cavities, or they may be squared cutouts providing contiguous spars. Still further the standoffs could be formed by beads (FIG. 6) or the like serving as spacers between the plate 19 and the substrate 24. Several adjacent electrodes 30, 32, 34, and 36 are disposed on or embedded in the substrate structure 24 wherein vias 38 and 40 provide feeds to a control module (not shown). The structure comprising elements 19 and 24 is not specific to a particular material combination. The structure may be for example silicon mounted to ceramic, silicon to polyimide materials, silicon to FLEX circuit board materials, silicon mounted to silicon, silicon bonded to silicon, silicon to thick film on any substrate material, or silicon to thin film on any substrate material.

Figure 7:
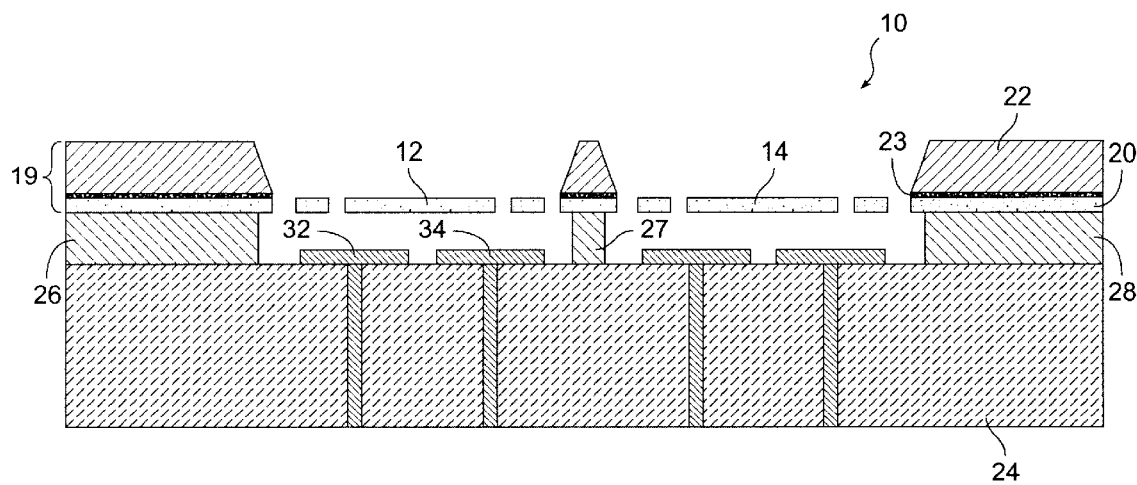
FIG. 7 is a cross-sectional view of a device according to the invention.
Figure 8:
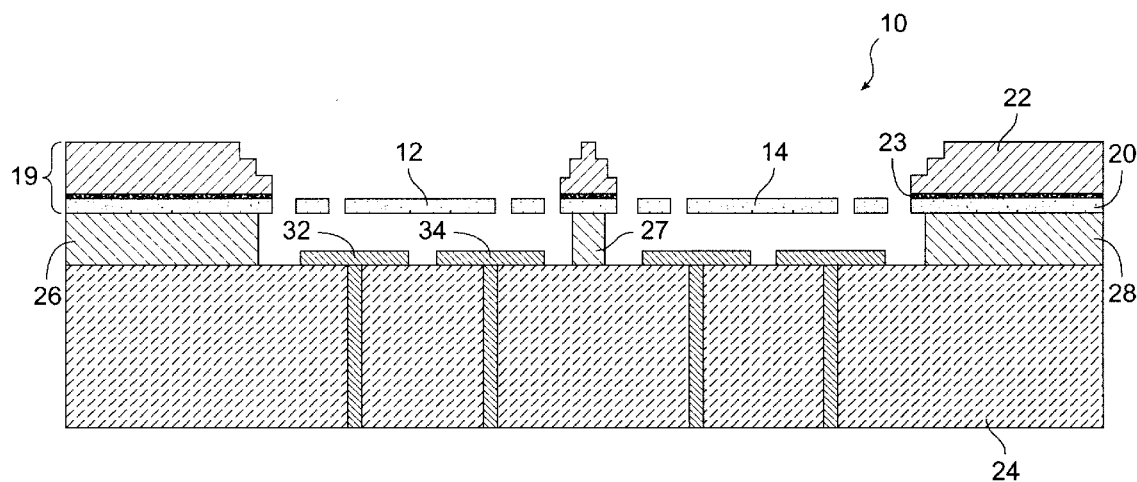
FIG. 8 is a cross-sectional view of a device according to the invention.

The standoff could be of SU-8, a type of photoresist that can give high aspect ratios. The handle 22 can be chamfered (FIG. 7) or stepped or terraced (FIG. 8) at the edge of the cavity to accommodate shallow angles of incident light directed to the mirrors.

DETAILED DESCRIPTION OF THE INVENTION

Figure 3:
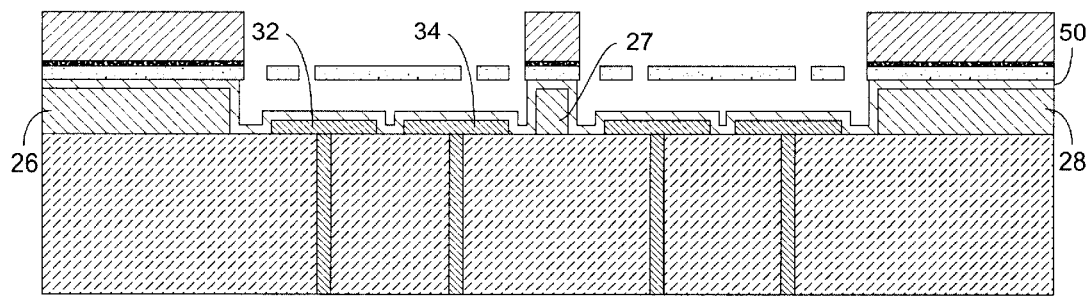
FIG. 3 is a cross-sectional view of a device according to the invention with a highly resistive conductive coating.

FIG. 3 illustrates a still further embodiment of the invention. A highly resistive conductive surface 50 is disposed as a coating over the electrodes 32, 34 and adjacent surfaces, including the nonconductive spacers or walls of the cavities formed by the spacers. The conductive surface 50 serves to suppress lateral field line penetration or crosstalk between the fields of the actuatable elements as hereinafter explained.

Figure 4:
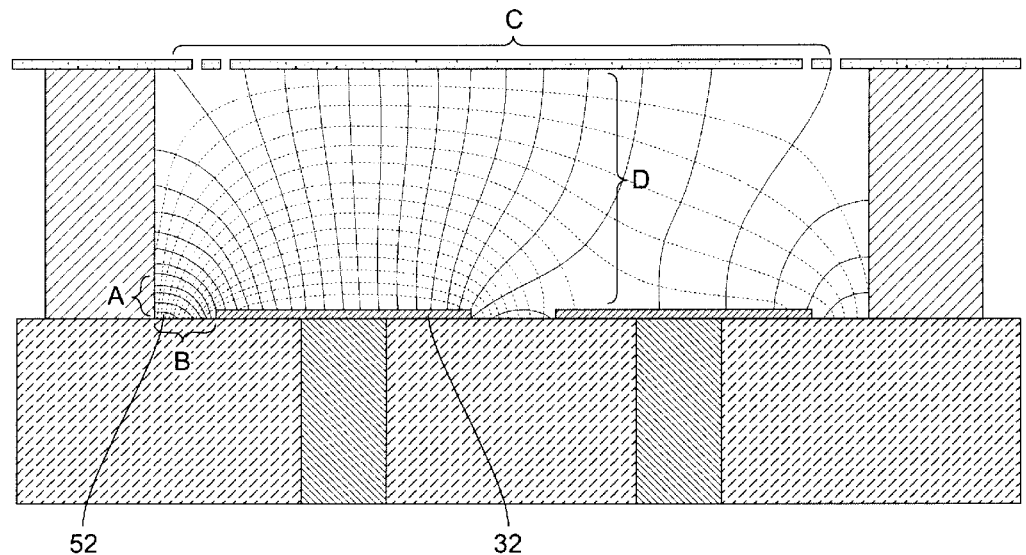
FIG. 4 is a cross-sectional view of another device not in accordance with the invention showing field lines illustrating less than ideal distribution of forces.

FIG. 4 is an illustration of a hypothetical cavity (not in accordance with the invention) showing field lines A associated with high potential differences over short distances (depicted by dashed isopotential lines B). The Figure also illustrates field lines C between the top surface of the electrostatic actuation electrodes 32 and the facing bottom surface of the MEMS actuatable element 12. The potential difference between elements 12 and 32 (depicted by dashed isopotential lines D) is limited by the breakdown potential in the region 52 due to the high potential gradient over the length of the region of concentrated isopotential lines B. A number of the field lines also terminate on the conductive side walls and thus do not contribute to the electrostatic force on the actuatable element 12s. The structure in FIG. 4 is not of a flipped SOI structure. As a consequence field lines terminating on the side walls represent wasted energy and a potential source of breakdown and nonlinear field distortion. It should be understood that the field lines should desirably terminate on the MEMS actuatable element 12 for maximum utilization of field energy. A further disadvantage is that the air gap (the distance between elements 12 and 32) is constrained by structural considerations. Due to limitations of minimum wafer thickness of an SOI wafer where the air gap is nominally set by wafer thickness, there is a minimum possible gap between an electrode and an actuatable element, thus limiting the force that can be applied to the actuatable element 12.

Figure 5:
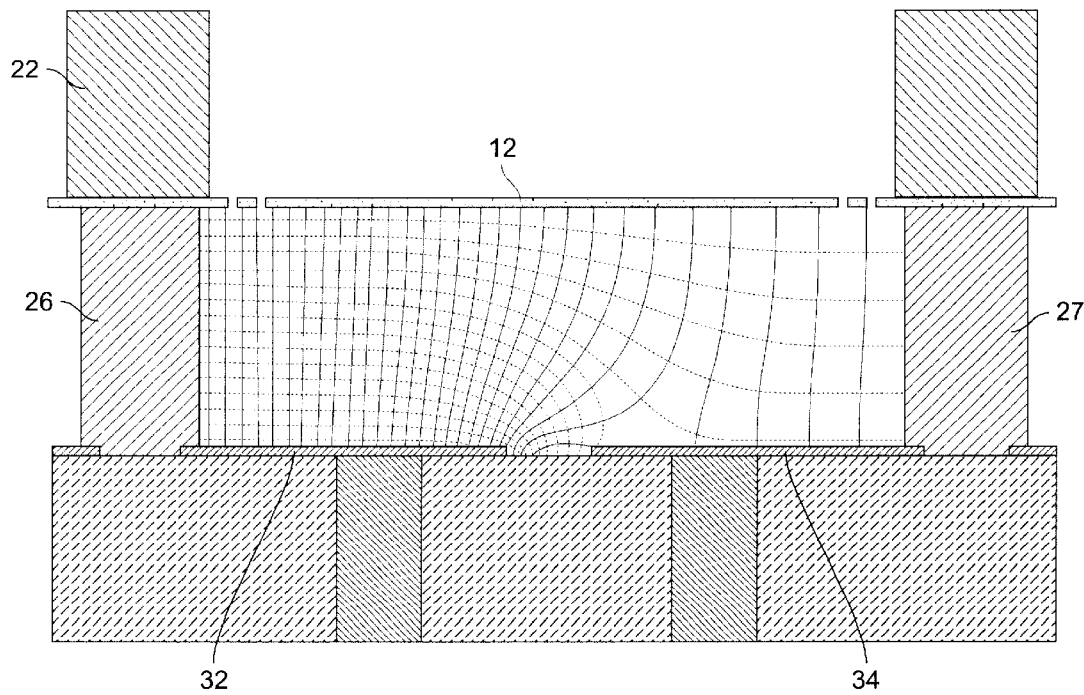
FIG. 5 is a cross-sectional view of a device in accordance with the invention showing field lines illustrating improved distribution of forces.

Referring now to FIG. 3, along with FIG. 5, the solution according to the invention is illustrated. By disposing the SOI wafer in an inverted configuration, namely with the SOI handle 22 outward and supported by standoffs 26, 27, the thickness of the standoffs define the air gap. In addition, the standoffs 26, 27 are nonconductive by design, and the field lines do not terminate on the standoffs. The field lines (FIG. 5) are more uniform, generally parallel and they extend between the electrode 32 and the actuatable element 12. There is some spreading of the field lines from the edge of the electrode 32 across the conductive surface of the actuatable element 12 due to the difference in size and difference in potential with an adjacent electrode 34. Thus, there is greater force efficiency.

The invention has been explained with reference to specific embodiments. Other embodiments will be evident to those of ordinary skill in the art. Therefore, it is not intended that this invention be limited, except as indicated by the appended claims.

What is claimed is:

1. A MEMS element comprising:

a substrate having a plurality of electrodes;

an actuatable element layer with an actuatable element disposed facing said electrodes on said substrate;

a plate formed of a handle structure in contact with said actuatable element layer, said handle-structure being sufficient to provide structural support for said actuatable element; and a standoff structure joining and spacing said substrate and said actuatable element layer.

2. The apparatus according to claim 1 wherein standoff structure is a dielectric material.

3. The apparatus according to claim 2 wherein the dielectric material is coated with a highly resistive conductive material to mitigate against crosstalk.

4. The apparatus according to claim 1 wherein said standoff structure is formed of a sheet with openings for the actuatable elements.

5. The apparatus according to claim 1 wherein said standoff structure is a crosshatch of ribs between actuatable elements.

6. The apparatus according to claim 1 wherein said standoff structure is formed of beads.

7. The apparatus according to claim 1 wherein the handle structure is chamfered along edges of the actuatable elements to accommodate shallow angles of incident light directed to said actuatable elements.

8. The apparatus according to claim 1 wherein the handle structure is terraced along edges of the actuatable elements to accommodate shallow angles of incident light directed to said actuatable elements.

\* \* \* \* \*